United States Patent
Modawar et al.

(10) Patent No.: US 8,829,485 B2
(45) Date of Patent: Sep. 9, 2014

(54) SELECTIVE EMITTER NANOWIRE ARRAY AND METHODS OF MAKING SAME

(75) Inventors: Faris Modawar, Georgetown, TX (US); Marcie R. Black, Lincoln, MA (US); Brian Murphy, Revere, MA (US); Jeff Miller, Brookline, MA (US); Mike Jura, Boston, MA (US)

(73) Assignee: Bandgap Engineering, Inc., Salem, NH (US)

( * ) Notice: Subject to any disclaimer, the term of this patent is extended or adjusted under 35 U.S.C. 154(b) by 305 days.

(21) Appl. No.: 13/353,091

(22) Filed: Jan. 18, 2012

(65) Prior Publication Data

US 2012/0153251 A1 Jun. 21, 2012

Related U.S. Application Data

(60) Provisional application No. 61/433,850, filed on Jan. 18, 2011.

(51) Int. Cl.
*H01L 29/06* (2006.01)
*H01L 31/0352* (2006.01)

(52) U.S. Cl.
CPC .............. *H01L 31/035227* (2013.01); *Y10S 977/762* (2013.01)
USPC ............... 257/9; 257/E21.09; 257/E29.024; 438/478; 977/762

(58) Field of Classification Search
None
See application file for complete search history.

(56) References Cited

U.S. PATENT DOCUMENTS

| 2007/0228523 | A1 | 10/2007 | Sharma |
| 2007/0278476 | A1 | 12/2007 | Black |
| 2008/0128760 | A1 | 6/2008 | Jun et al. |
| 2009/0239330 | A1 | 9/2009 | Vanheusden et al. |
| 2010/0065819 | A1* | 3/2010 | Wu .................................. 257/21 |
| 2011/0000060 | A1 | 1/2011 | Lee et al. |
| 2012/0153250 | A1 | 6/2012 | Modawar et al. |
| 2012/0181502 | A1 | 7/2012 | Modawar et al. |

FOREIGN PATENT DOCUMENTS

WO    WO-2010/042209 A1    4/2010

OTHER PUBLICATIONS

Fang et al. ("Fabrication of Slantingly-Aligned Silicon Nanowire Arrays for Solar Cell Applications," Nanotechnology 19, pp. 1-6, 2008).*
Kelzenberg et al. ("Single-Nanowire Si Solar Cells," Proceedings of the 33rd IEEE PVSC (2008)—Thin Film Photovoltaics).*
Chan et al., "High-performance Lithium Battery Anodes Using Silicon Nanowires," Nature Nanotechnology, vol. 3, Jan. 2008, pp. 31-35.
Fang et al., "Fabrication of Slantingly-Aligned Silicon Nanowire Arrays for Solar Cell Applications," Nanotechnology, 19, 2008, 6 pages.

(Continued)

*Primary Examiner* — Yasser A Abdelaziez

(57) ABSTRACT

Another aspect of the present disclosure relates to a device including a substrate, having a top surface and a bottom surface; an array of nanowires having a base and a top surface, the base contacting the top surface of the substrate; a contacting structure including the same material as the substrate having a non-nanostructured surface of a dimension suitable for forming an electrical contact, located on the same side of the substrate as the array of silicon nanowires; wherein the contacting structure is doped with a greater impurity concentration than the nanowire array, thereby forming a selective emitter.

17 Claims, 12 Drawing Sheets

(56) References Cited

OTHER PUBLICATIONS

International Search Report and Written Opinion of the International Searching Authority, The United States Patent and Trademark Office, for International Application No. PCT/US2012/021709, mailing date May 2, 2012, 12 pages.

Kelzenberg, et al., "Photovoltaic Measurements in Single-Nanowire Silicon Solar Cells," Nano Letters, 2008, vol. 8, No. 2, pp. 710-714.

Luque et al., "Increasing the Efficiency of Ideal Solar Cells by Photon Induced Transitions at Intermediate Levels," Physical Review Letters, vol. 78, No. 26, Jun. 1997, pp. 5014-5017.

Martin-Palma et al., "Antireflective Porous-Silicon Coatings for Multicrystalline Solar Cells: The Effects of Chemical Etching and Rapid Thermal Processing," Semicond. Sci. Technol., 16, 2001, pp. 657-661.

Peng, et al., "Fabrication of Large-Area Silicon Nanowire p-n Junction Diode Arrays," Adv. Mater., Jan. 2004, 16, No. 1, pp. 73-76.

Tsakalakos, et al., "Silicon Nanowire Solar Cells," Applied Physics Letters, 91, 233117-1 to 233117-3, 2007.

* cited by examiner

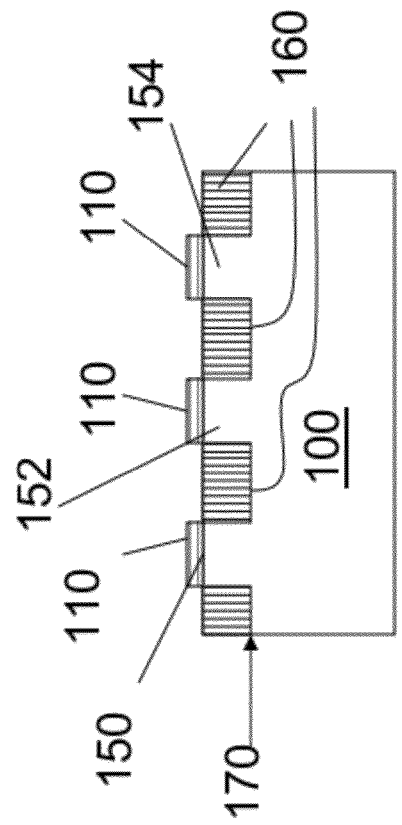
FIG. 1D
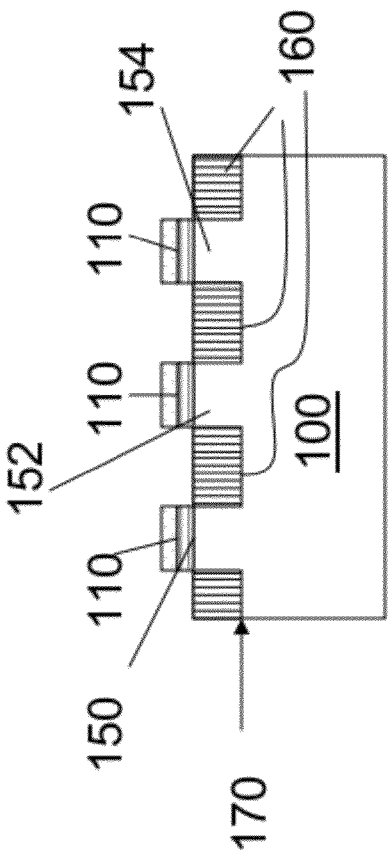
FIG. 1E
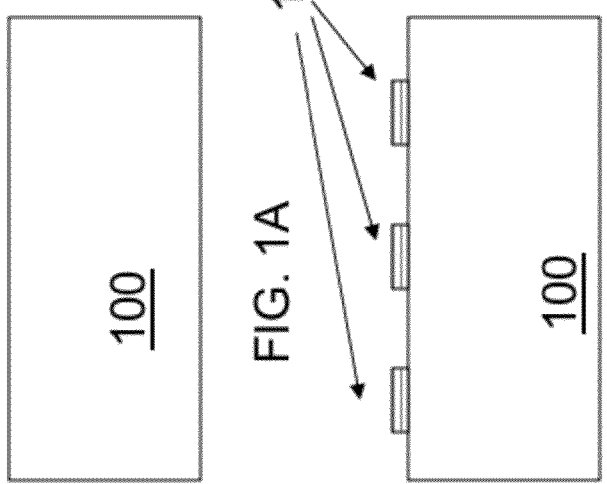
FIG. 1A
FIG. 1B
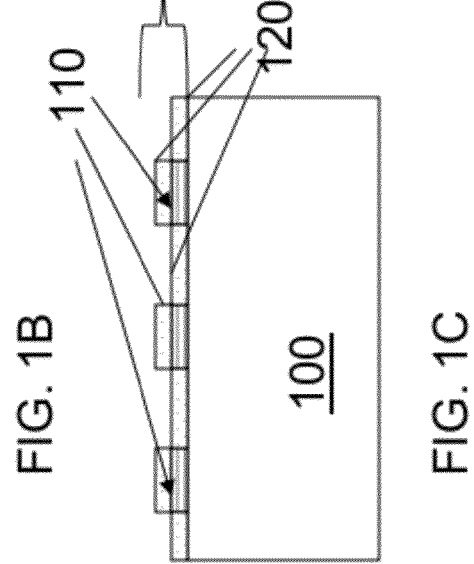
FIG. 1C

Scheme 1

Scheme 2

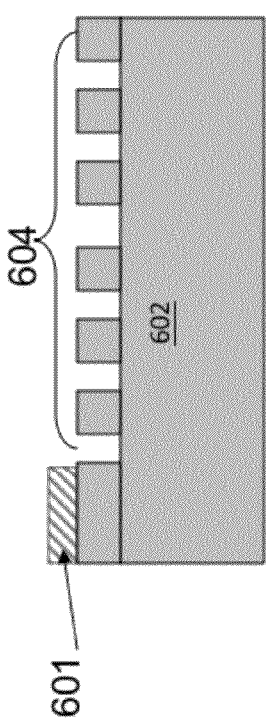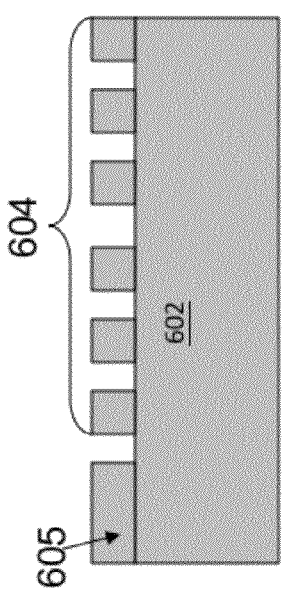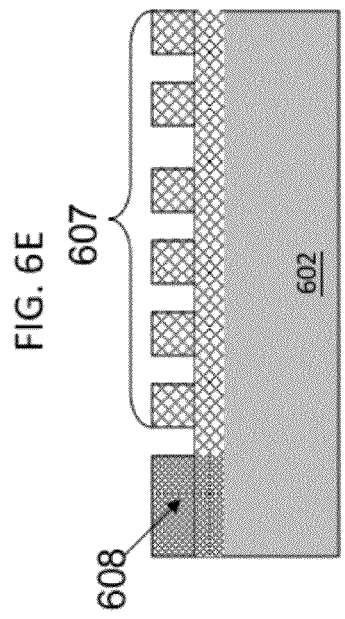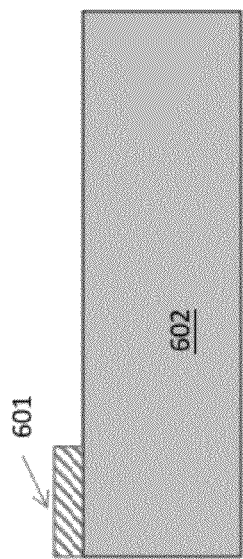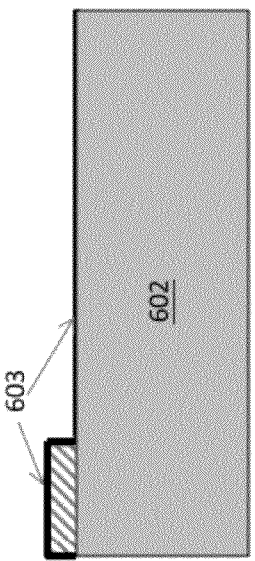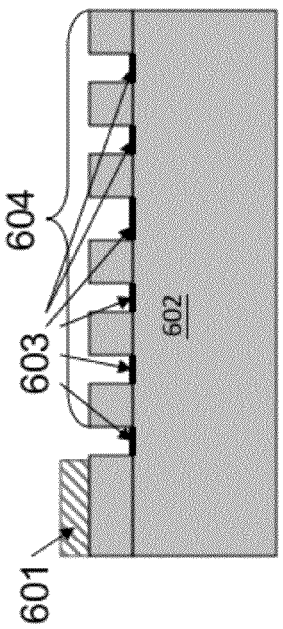
FIGs. 6A-F

Scheme 3

SELECTIVE EMITTER NANOWIRE ARRAY AND METHODS OF MAKING SAME

CROSS REFERENCE TO RELATED APPLICATIONS

This application claims the benefit under 35 U.S.C. §119 (e) of U.S. Provisional Application No. 61/433,850, filed Jan. 18, 2011 and entitled "Method of Electrically Contacting Nanowire Arrays," the entire contents of which are incorporated herein by reference.

FIELD OF INVENTION

The present disclosure relates to black silicon devices, for example, devices having nanostructures, and selective emitters, both for use in photovoltaic devices.

BACKGROUND

Semiconductor nanowires have become the focal point of research over the last decade due to their interesting physical, chemical and biological properties. There is particular interest surrounding silicon nanowires, as silicon is one of the most abundant materials in the earth's crust and has become a cornerstone for many of the electronic, optoelectronic, electro-chemical, and electro-mechanical devices upon which designs are based.

A silicon nanowire array on top of a silicon substrate can alter the opto-electrical properties of the bulk silicon substrate. For example, a silicon nanowire array reduces the reflection of the silicon substrate, reduces the reflection at off-angles of incidence, and increases the absorption of the silicon in ways similar to traditional pyramids or light trapping mechanisms used in solar cells.

Some of the altered optical-electrical properties of silicon nanowires compared to bulk silicon are beneficial for solar cells. However, in order to form a solar cell, the two sides of a p-n junction need to be connected to the outside world. Unfortunately, contacting nanowires is not always easy.

One device design for nanowire solar cells places vertically aligned nanowires on top of a bulk (non-nanostructured) substrate. In this design, the back contact can easily be made from the backside of the substrate. The front contact, however, is more difficult to make.

The contact resistance increases the smaller the contact area. If contacts are made on top of the nanowire array, only the tips of the wires are in contact with the metal, and hence the contact resistance may be undesirably high. Too high contact resistance adversely impacts device efficiency.

Contacting the top of the nanowires can be done uniformly with a transparent conductor. If a transparent conductor is used, some of the light is absorbed inside the conductor. In addition, the sheet resistance of transparent conductors is higher than that of metals, which leads to resistive losses. The nanowires can also be contacted by metal fingers in which case the current generated in a nanowire not directly contacted needs to travel down that wire and then back up the wire with the metal contact on top before creating current.

Nanowires may also be contacted by sputtering (or evaporating) metal on top of the wires. Although this contact method is sufficient to obtain working solar cells, the contact resistance of this method may be undesirably high for best solar cell efficiency. In addition, part of the sputtered or evaporated metal drops below the nanowires and can cause other issues that limit efficiency such as added recombination centers or shorting of the p-n junction. For example, in reference (g) cited below, sputtering of contacts on nanowire arrays approximately perpendicular to the substrate gave relatively poor efficiency (9.3%) because of resistance. The same authors later arranged the nanowires so that they were slanted, and the efficiency of the solar cell increased to 11.37%.

Some methods of making nanowire arrays allow for a contact beside the base of the nanowire array. Although this contact method is useful for processes that grow wires such as vapor liquid solid processes, it is not easy to implement for processes that etch nanowires into a bulk substrate.

Other methods of contacting a nanowire solar cell include a submerged contact, where the contact is at the base of the nanowire array, as described in U.S. Published Patent Application No. 2010/0122725. This method has the advantage that the contacts do not shade the light from the top nanowire surface. In addition, the metal silicon contact area is relatively flat compared to the nanowire array. Unfortunately, this design has the limitation that most of the incident light should be absorbed in the nanowire array before it is incident onto the submerged contact. If the light is not absorbed in the nanowires before reaching the submerged contact, much of the light will be absorbed in the metal. In situations where the wires are not long enough to absorb enough of the light to give the targeted efficiency, a submerged contact is non-ideal.

A process for fabricating nanowire arrays is described in U.S. Published Patent Application No. 2009/0256134. In this process, one deposits nanoparticles and a metal film onto the substrate in such a way that the metal is present and touches silicon where etching is desired and is blocked from touching silicon or not present elsewhere. One submerges the metallized substrate into an etchant aqueous solution comprising hydrofluoric acid (HF) and an oxidizing agent. In this way, arrays of nanowires with controlled diameter and length are produced.

When forming solar cells, the doping profile is an important consideration for optimizing the cell. A design engineer has to consider many device parameters that are affected by the doping profile, and balance conflicting requirements. One such trade-off is the surface doping; front contacts have lower resistance contact to the silicon surface if the doping of that silicon is high, e.g., greater than $10^{19}/cm^3$. However, higher doping levels lead to free carrier recombination, a higher level of impurity defects, and a high surface recombination velocity; all of which hurt the efficiency of a cell. One approach to ease this trade off of doping is to have high doping under the contacts, leading to low contact resistance, and low doping between the contacts in the active region of the device, leading to higher internal quantum efficiency. This approach is referred to as a selective emitter and is often used in high efficiency solar cell designs. A selective emitter usually requires an additional patterning step, and therefore added cost to the solar cell.

Relevant information regarding silicon fabrication processes known to those of skill in the art can be found, for example, in Sami Franssila, *Introduction to Microfabrication* (John Wiley & Sons 2004), and the references cited there.

SUMMARY

In one aspect, the present disclosure relates to a device including a substrate, having a top surface and a bottom surface; an array of nanowires having a base and a top surface, the base contacting the top surface of the substrate; a contacting structure having a non-nanostructured surface, having a top surface and a bottom surface, located on the same side of the substrate as the array of silicon nanowires and disposed above the top surface of the substrate; and an electrical contact in contact with the top surface of the contacting structure. In some embodiments, the device includes an aluminum oxide passivation layer over the array of nanowires. In some embodiments, the layer of aluminum oxide is deposited via atomic layer deposition. In some embodiments, the electrical contact is level with the top of the nanowire array. In some embodiments, the electrical contact is above the top of the nanowire array. In some embodiments, the substrate and nanowires of the array can be silicon. In some embodiments, the devices includes a p-n junction which is below the base of the nanowire array. In some embodiments, the device is a photovoltaic cell. In some embodiments, the contacting structure is integral with the substrate.

In some embodiments, the electrical contact includes a stack of films, wherein the stack includes a first film that acts as a barrier to diffusion of the second film, a second film that provides a path for current, and a third film that protects the second film from etching. In some embodiments, the first film of the electrical contact can be a metal. In some embodiments, the contacting structure is doped with a greater impurity concentration than the nanowire array, thereby forming a selective emitter.

Another aspect of the present disclosure relates to a method for obtaining a device including a nanowire array. In some embodiments, the method includes depositing a first metal on a substrate in a pattern suitable for forming contacts; depositing a thin film of a second metal on top of the substrate including areas which are covered with the metal deposited in the first step; exposing the substrate to an etchant aqueous solution includes an etching agent and an oxidizing agent, thereby forming a nanowire array; and optionally removing the thin film of the second metal, wherein the metal deposited the first step is resilient to the etch.

In some embodiments, the film deposited in the first step includes a metal stack, wherein the metal stack includes at least three films, a first film that acts as a barrier to diffusion of the second film, a second film that provides a low resistance path for current, and a third film that protects the second film from the etch.

Another aspect of the present disclosure relates to a device including a substrate, having a top surface and a bottom surface; an array of nanowires having a base and a top surface, the base contacting the top surface of the substrate; a contacting structure including the same material as the substrate having a non-nanostructured surface of a dimension suitable for forming an electrical contact, located on the same side of the substrate as the array of silicon nanowires; wherein the contacting structure is doped with a greater impurity concentration than the nanowire array, thereby forming a selective emitter.

In some embodiments, the device further includes an conductive layer in contact with the non-nanostructured surface of contacting structure. In some embodiments, the conductive layer can be a metal. In some embodiments, the dopant level in the contact region can be greater than 1e19 $cm^{-3}$ for the contact region. In some embodiments, the dopant can be boron, phosphorous, or arsenic. In some embodiments, the dopant level in the nanowires is less than 5e18 $cm^{-3}$.

Another aspect of the present disclosure relates to a method for forming a nanowire array. In some embodiments, the method includes depositing a first material on a substrate in a pattern suitable for forming contacts with the substrate surface; depositing a thin film of a second material which is a metal on top of the substrate including areas which are covered with the first material deposited in the first step; exposing the substrate to an etchant aqueous solution includes an etching agent and an oxidizing agent, thereby forming a nanowire array, wherein the layer of material deposited in the first step is resilient to the etch; and removing the thin film of a second material and the material deposited in the first step to provide a contact structure having a non-nanostructured surface.

In some embodiments, the method further includes doping the substrate to form a p-n junction, wherein the contacting structure dopes more heavily than the nanowire array to thereby form a selective emitter. In some embodiments, the method includes applying a metal contact over the contact structure.

In one aspect, the present disclosure relates to a process of manufacturing a device including a nanowire array, including the steps of forming the nanowire array and passivating the device by depositing a layer of alumina on the nanowire array. In some embodiments, the alumina is deposited by atomic layer deposition.

In one aspect, the present disclosure relates to a device including a silicon substrate, wherein at least a portion of the substrate surface can be a silicon nanowire array; and a layer of alumina covering the silicon nanowire array. In some embodiments, the device can be a solar cell. In some embodiments, the device can be a p-n junction. In some embodiments, the p-n junction can be located below the bottom surface the nanowire array.

Another aspect of the present disclosure relates to a device including a substrate, having a top surface and a bottom surface; a section of black silicon having a base and a top surface, the base contacting the top surface of the substrate; a contacting structure having a non-nanostructured surface, having a top surface and a bottom surface, located on the same side of the substrate as the section of black silicon and disposed above the top surface of the substrate; and an electrical contact in contact with the top surface of the contacting structure. In some embodiments, the section of black silicon includes an array of nanowires. In some embodiment, the section of black silicon comprises porous silicon. In some embodiments, the section of black silicon includes silicon having a graded index of refraction. In some embodiments, the section of black silicon includes silicon having a needle-shaped surface structure.

In one aspect the present disclosure relates to a device including a substrate, having a top surface and a bottom surface; a section of black silicon having a base and a top surface, the base contacting the top surface of the substrate; and a contacting structure comprises of the same material as the substrate having a non-nanostructured surface of a dimension suitable for forming an electrical contact, located on the same side of the substrate as the section of black silicon; wherein the contacting structure is doped with a greater impurity concentration than the section of black silicon, thereby forming a selective emitter. In some embodiments, the section of black silicon comprises an array of nanowires. In some embodiment, the section of black silicon includes porous silicon. In some embodiments, the section of black silicon includes silicon having a graded index of refraction. In some embodiments, the section of black silicon includes silicon having a needle-shaped surface structure.

Another aspect of the present disclosure relates to a device including silicon substrate, wherein at least a portion of the substrate surface comprises a black silicon; and a layer of alumina covering the black silicon In some embodiments, the black silicon includes an array of nanowires. In some embodiment, the black silicon comprises porous silicon. In some embodiments, the black silicon includes silicon having a graded index of refraction. In some embodiment, the section of black silicon includes silicon having a needle-shaped surface structure.

BRIEF DESCRIPTION OF THE FIGURES

Various objects, features, and advantages of the present disclosure can be more fully appreciated with reference to the following detailed description when considered in connection with the following drawings, in which like reference numerals identify like elements. The following drawings are for the purpose of illustration only and are not intended to be limiting of the invention, the scope of which is set forth in the claims that follow.

FIGS. 1A-E depict a process flow for making a raised contact according to embodiments of the present disclosure.

FIGS. 6A-F depict a process flow for making a selective emitter, according to embodiments of the present disclosure.

DETAILED DESCRIPTION

Before describing the present invention in detail, it is to be understood that this invention is not limited to specific solvents, materials, or device structures, as such may vary. It is also to be understood that the terminology used herein is for the purpose of describing particular embodiments only, and is not intended to be limiting.

Figure 2:
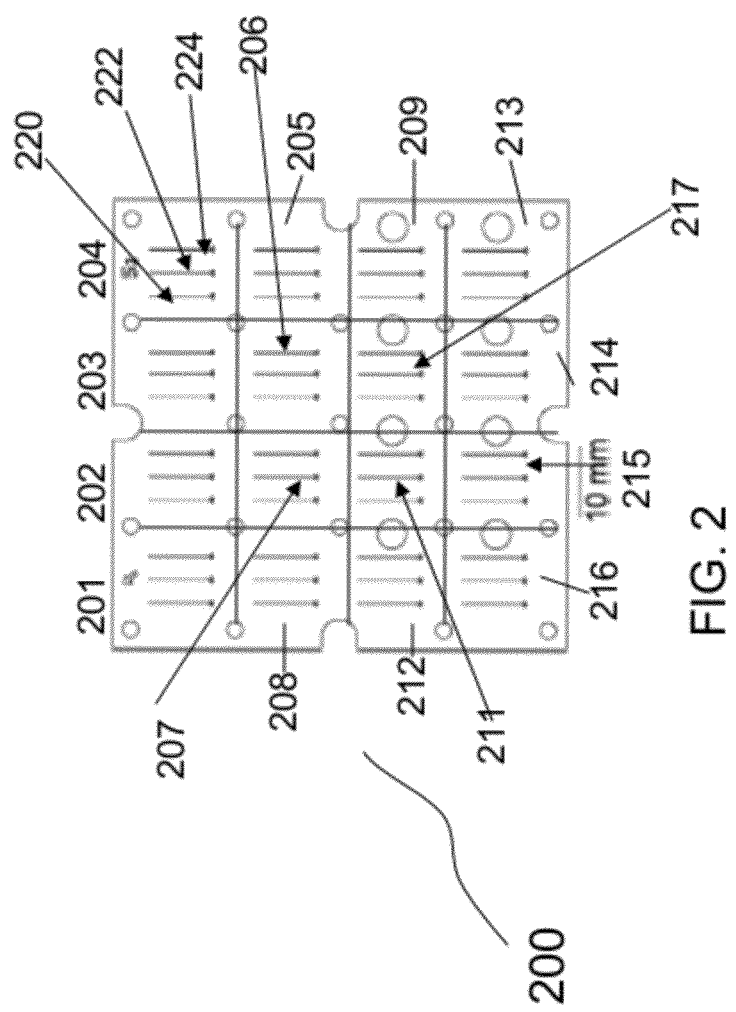
FIG. 2 depicts an example of a mask which can be used to make a raised contact.

In an aspect of the invention, a process is provided for forming a contact to electrically contact silicon nanowire arrays. FIGS. 1A-E depict a process flow for making a raised contact according to embodiments of the present disclosure. In FIG. 1A, a substrate 100 is provided. The substrate 100 can be silicon. Next, as shown in FIG. 1B, one deposits and patterns onto the substrate 100 a metal film 110. Metal film 110 can be any metal material that can survive the nanowire etch formation, for example, tungsten. The metal film 110 can be applied using a mask, which is selected to provide a metal pattern suitable for forming an electrical contact with the front side of the substrate. FIG. 2 depicts an example of a mask 200 which can be used to make a raised contact. Mask 200 is configured for sixteen separate cells 201-209, 211-217. Each cell contains three slots 220, 222, 224, which will correspond to the raised contacts in the final device referred to as "metal finger(s)." Other patterns or masks can be used to form the metal fingers as is known in the art.

Next, as shown in FIG. 1C, a thin film of metal 120, for example, silver, is then deposited onto the substrate 100 over the patterned metal film 110. Alternatively, other thin films of metals that enhance the etching of silicon in the presence of an oxidizer and HF can be used instead of the thin film of silver. These include, for example, Ni and Au. The combination of the substrate 100, patterned metal film 110 and thin metal 120 can be referred to as a metalized substrate 140.

Next, as shown in FIG. 1D, one then submerges the metalized substrate 140 into an etchant aqueous solution comprising about 4 to about 49 weight percent HF and an oxidizing agent. Under suitable conditions, nanowires 160 are etched into the silicon substrate where the thin metal layer of silver is present but not where the patterned metal finger(s) 110 are present. As shown in FIG. 1E, this results in a substrate 100 with a plurality of raised contact areas 150, 152, 154, corresponding to the layout of the mask under metal fingers 110, while the remaining portions of substrate 100 are silicon nanowires 160. These metal finger(s) overlying the non-nanostructured contact area 150, 152, 154 thus result in a silicon contacting structure that is raised above the base 170 of the nanowire array. The metal finger(s) 110 provide electrical contact to the contacting structure which in this case is a section of silicon without nanowires. The thin silver film that remains on the top surface of metal fingers 110 can then be removed, for example, with a standard Piranha etch (not shown). The remaining contact structure 150, 152, 154 are not nanostructured like the remainder of the silicon nanowires.

In a process as described above, to achieve nanowires with controllable geometry, one may use nanoparticles to block the silver from the silicon. The nanoparticles may be made of a variety of substances, for example silicon dioxide, iron oxide, or polymers. They are deposited (for example, sputtering or spin coating) before the thin layer of silver is deposited onto the surface.

Figure 3A:
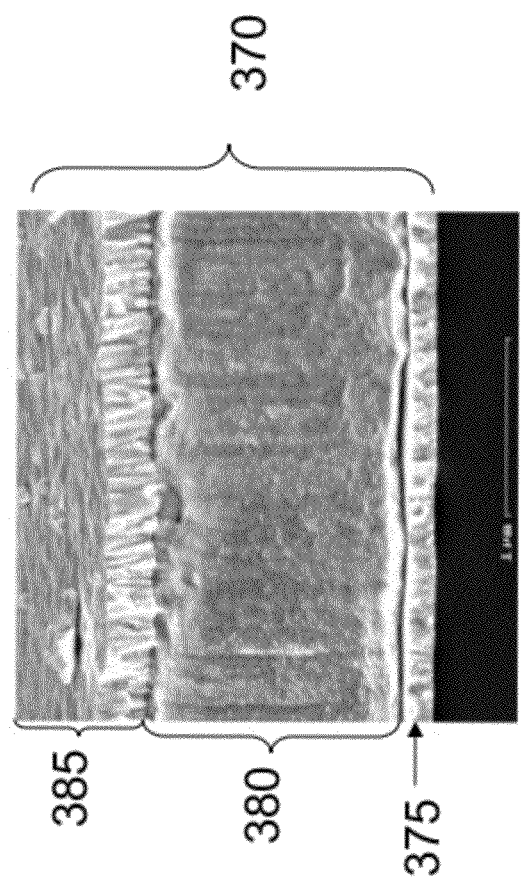
FIG. 3A depicts a cross-sectional scanning electron microscope (SEM) image of a raised contact made with the first exemplary process of FIG. 1 using the mask shown in FIG. 2.

FIG. 3A depicts a cross-sectional SEM of a raised contact made with the first exemplary process of FIG. 1 using the mask shown in FIG. 2. The metal stack 370 is shown after the nanowire etch and consists of layers of tungsten 375, silver 380, and a second layer of tungsten 385.

Figure 3B:
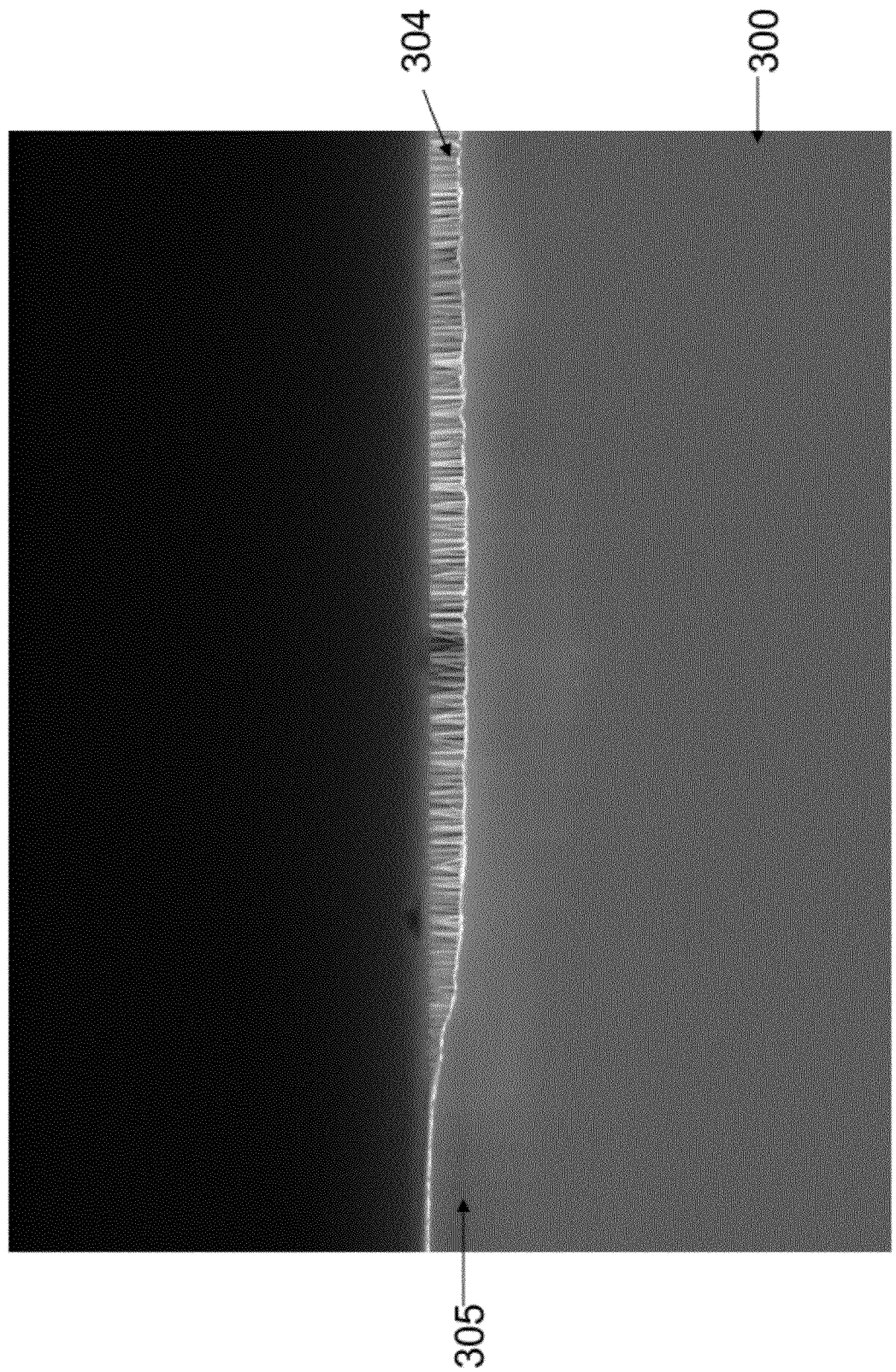
FIG. 3B is a cross-sectional SEM image of a raised contact, according to embodiments of the present disclosure.

FIG. 3B is an SEM image of the raised silicon structures 305 surrounded by nanowire arrays 304 on a silicon substrate 300.

Figure 3C:
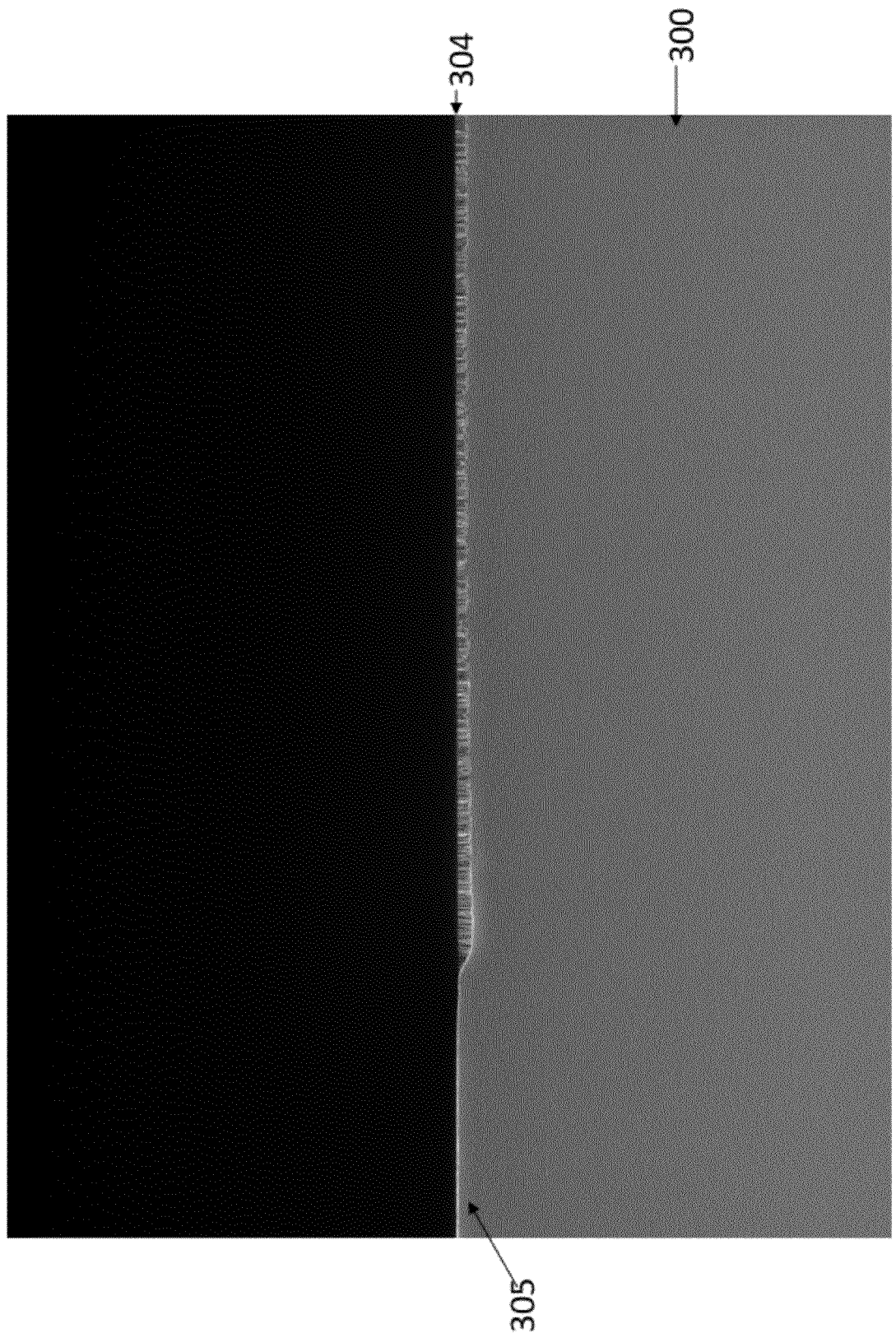
FIG. 3C is a cross-sectional SEM image of a raised contact, according to embodiments of the present disclosure.

FIG. 3C is an SEM image of the raised silicon structures 305 surrounded by nanowire arrays 304 on a silicon substrate 300.

Figure 3D:
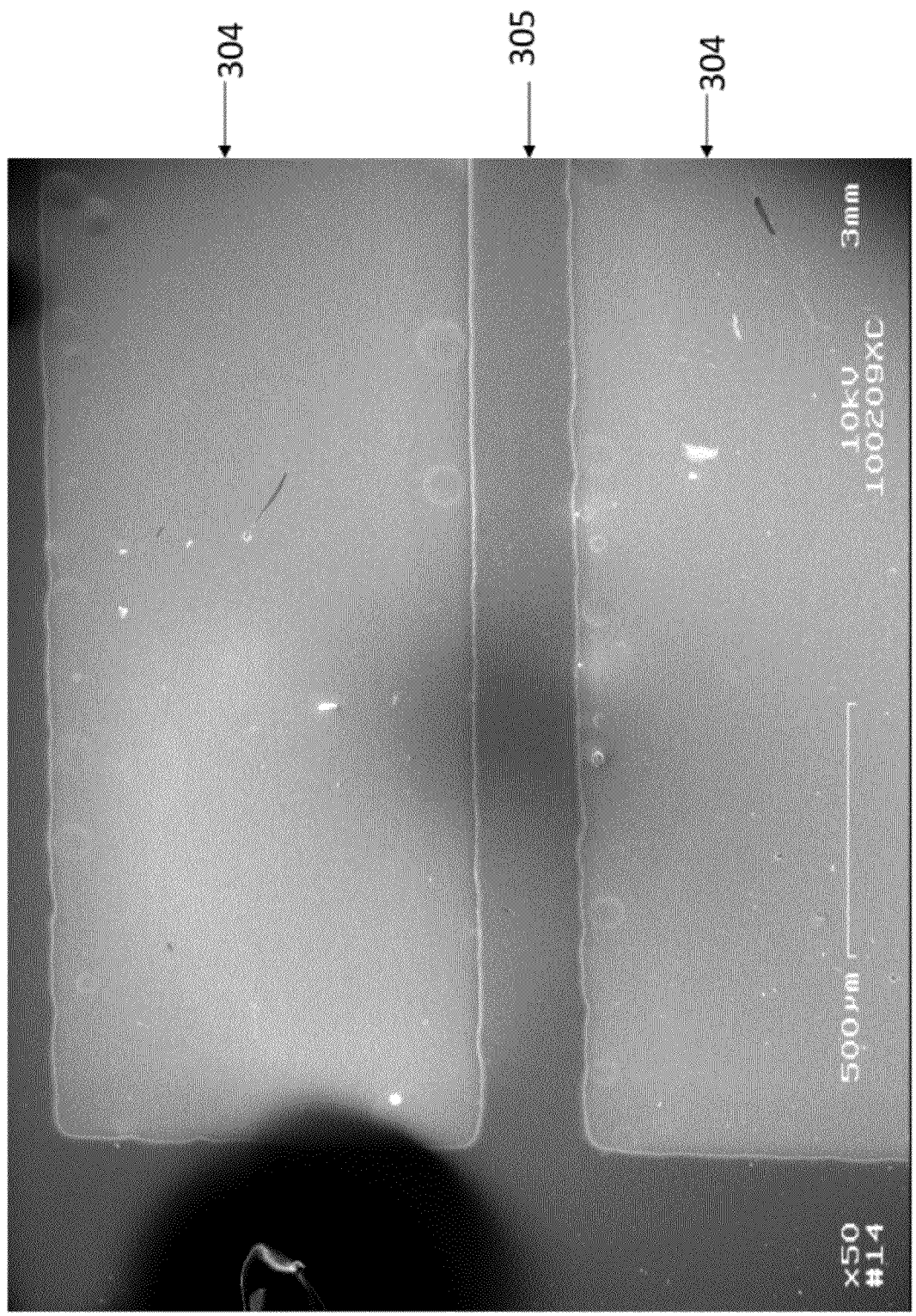
FIG. 3D is a top view SEM image of raised contact, according to embodiments of the present disclosure.

FIG. 3D is an SEM image top view of the raised silicon structure 305 surrounded by nanowire arrays 304.

A. First Exemplary Process

Figure 4A:
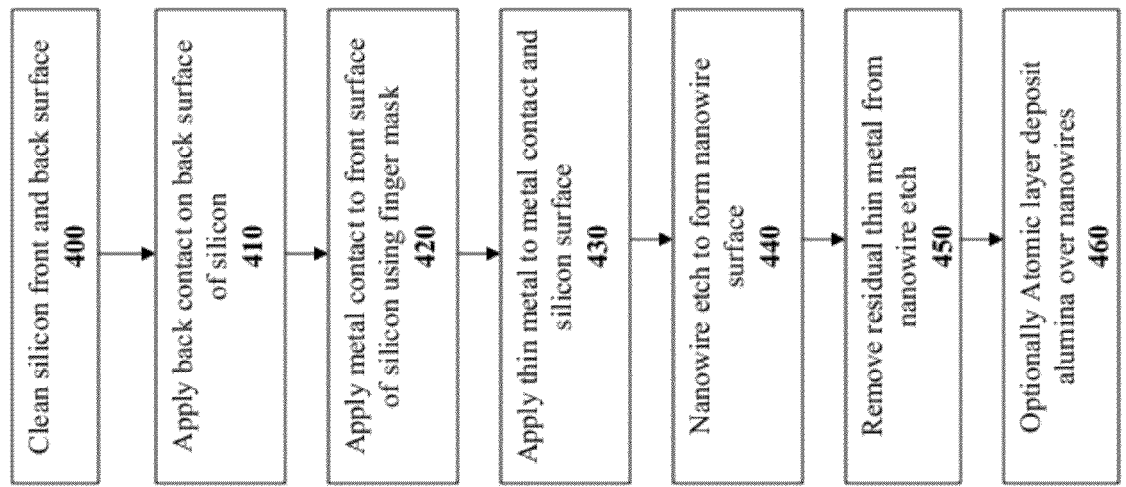
FIG. 4A is high level flow chart of a first processing scheme according to some embodiments of the present disclosure.

The process is explained with reference to process Scheme 1, depicted in FIG. 4. Silicon material with a resistivity of about 0.05 to 10 ohm-cm can be used having a surface with (100), (110), (111) or any orientation available. Amorphous and/or microcrystalline material may be used, and can also generally result in vertically oriented nanowires if one carries out the following process. The silicon substrate preferably has a bulk with n-type doping around $10^{17}$ cm$^{-3}$ with a front junction made by diffusing p-type dopants into the substrate at a depth >about 0.9 µm, or >about 1 µm or >about 2 µm. For example, a junction depth of about 1.5 µm may be employed. The surface doping may have a concentration on the order of $2\times10^{19}$ cm$^{-3}$ and may be considered to be heavy doping. In addition, the backside may have a shallow diffused phosphorus doping appropriate for a back surface field. Alternatively, the silicon substrate can have a bulk p-type doping and a front junction made by n-type dopants. In some embodiments, the junction is formed on the backside of the device opposite the nanowire array. This backside junction can be a formed by an amorphous silicon heterojunction.

As shown in FIG. 4, the substrate is first pre-cleaned in step 400. The substrate is cleaned using a series of solvents by sonicating for three minutes each in acetone, isopropyl alcohol (IPA), and then methanol. The substrate is then blown dry with nitrogen ($N_2$) and then placed into an ozone clean for 5 minutes, at 70° C., with oxygen ($O_2$) flowing at a rate of 50 standard cubic centimeters per minute (SCCM). Immediately after the ozone clean, the sample is placed into a Piranha solution made up of 3 parts 96% $H_2SO_4$ and 1 part 30 wt % $H_2O_2$ for 3 minutes at 120° C. in order to remove any additional organics and create a hydrophilic surface. The substrate is then removed from the bath and placed into a de-ionized water (DI) bath in which the substrates are rinsed. The substrate may be rinsed one or several times, for example, three times. Removing the substrate and blowing it dry with nitrogen gas then complete the preclean.

Next the oxide which is grown during the Piranha etch is removed and a fresh oxide is grown. The substrate is then dipped into a solution of dilute hydrofluoric acid (HF) (1 ounce 49% HF to 4 ounces of DI water) to remove the oxide. After the HF bath, the sample is rinsed, for example, three times in DI water and blown dry with $N_2$. The sample then returns to the ozone to grow a thin layer of oxide. Again the ozone clean is done for 5 minutes, at 70° C., with $O_2$ flowing at a rate of 50 SCCM.

Next, the back contact is placed onto the back side of the substrate in step 410 as follows. The back contact can either be uniform across the substrate, or patterned with a mask (as shown in FIG. 2) for fingers (as with the front side of the substrate). Within 10 minutes of completion of the ozone clean, the samples are mounted onto a carrier chuck with or without a shadow mask of the finger pattern on top. The carrier chuck, sample, and mask are then loaded into the sputtering chamber with a load lock.

First 1000 Å of tungsten (W) is deposited on the back side of the substrate. The tungsten is expected to act as a barrier layer for the silver (Ag) film. A base pressure of less than 2 mTorr is used to ensure high quality deposition. The process is performed at room temperature at a rate of 3 Å/second. Without breaking vacuum, at the same pressure, the sample is rotated to the silver target, and 10,000 Å of silver is deposited at 5 Å/sec. This silver provides low resistance for the metal figure. Next, the sample is rotated back to the tungsten target, again without breaking vacuum. Again, 2000 Å of W at 3 Å/sec is deposited. This second layer of W is to protect the underlying silver from etches that attack Ag but not W. All of this deposition is performed through a shadow mask to define the contact area.

Next, a metal contact is applied to front surface of silicon using finger mask in step 420. Following formation of the back contact, the sample is then removed from the sputtering chamber, the mask is removed, and the substrate is flipped and remounted back onto the carrier chuck. This time a finger mask (as shown in FIG. 2) for the contacting structure is placed on top surface of the substrate. This carrier chuck, substrate, and mask are then loaded into the sputtering chamber with a load lock. A three part metal stack is deposited onto the top of the sample—1000 Å tungsten, 10,000 Å of silver, and 2000 Å of tungsten.

Figure 4B:
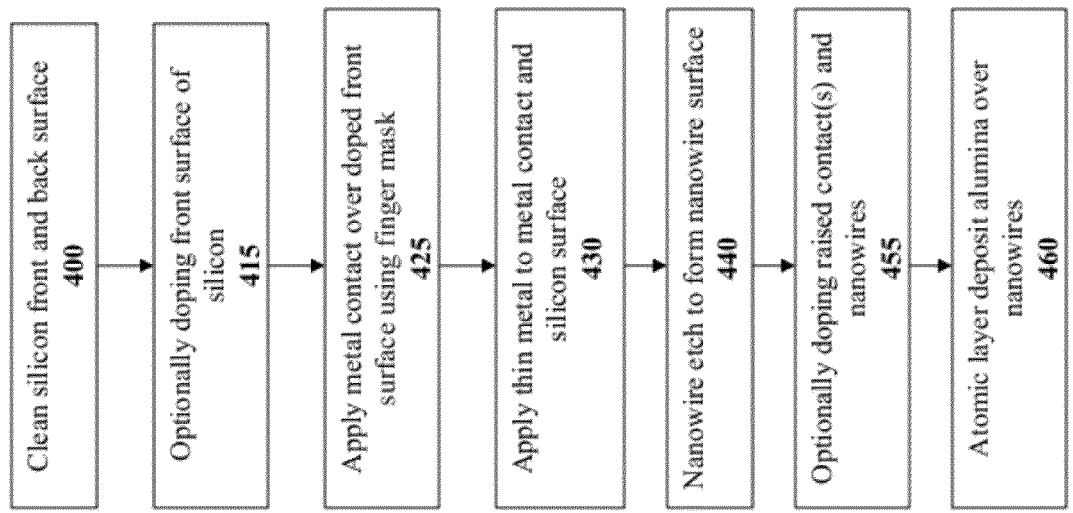
FIG. 4B is high level flow chart of a second processing scheme according to some embodiments of the present disclosure.

Prior to the deposition of the tungsten/silver/tungsten stack, it may be desirable to deposit a dopant or a material containing a dopant (or dopants), producing a highly doped zone. Thus, in an alternative process shown in process Scheme 2, as shown in FIG. 4B. In this embodiment, a back contact is not applied to the back surface of the silicon prior to applying the metal contacts, as shown in step 210 of Scheme 1 in FIG. 4A, and a dopant optionally can be deposited on the front surface of the silicon before the metal contacts are deposited as shown in step 415. In some embodiments the back contact is applied before applying the metal contacts, as shown in Scheme 1, however, the back contact can be applied after the metal contacts are applied. The finger metal stack is then deposited in step 425, which will protect the dopant/doped material underneath the front contacts, but the nanowire etch can be adjusted to etch off the highly doped material elsewhere on the front surface. Additionally, as shown in step 455, the raised contact(s) and nanowires can be doped once the nanowire surface has been formed (discussed below). Alternatively, the highly doped region can be etched off separately before nanowires are formed. One such etch that can etch off the top highly doped region except where the metal stack protects the silicon employs 126 parts $HNO_3$, 60 parts water, and 5 parts $NH_4F$. Using a tungsten-containing front contact and then etching off the exposed silicon has value, even if one does not form nanowire arrays, in order to provide a selective emitter on the contacting structure. The selective emitter embodiment is discussed in more detail below. Alternatively, one can deposit a doped material prior to depositing the metal finger(s), using the same finger mask. This will only deposit the doped material in the areas that will also have the metal finger(s).

The sample is then removed from the sputtering chamber. The mask is removed, and the sample placed back on the carrier chuck and placed back into the sputtering system through the load lock. The final thin metal layer, e.g., silver, as shown in step 430 of Schemes 1 and 2 is sputtered onto the substrate at a rate of 5 Å/sec. with a thickness of 65 Å.

Once the chip is coated with the appropriate films of W, Ag, W, and Ag, photo resist is painted onto the backside of the sample. This may be, for example, Shipley 1805 photo resist which is painted on with a paintbrush at RT. The photo resist is then baked at 90° C. on a hot plate for 5 minutes.

The sample is then etched to form a nanowire surface in step 440. The nanowire etch occurs in an HF solution with an oxidizer. In this particular case, the oxidizer is oxygen gas.

Before commencing the etching reaction, the HF solution is seasoned by bubbling oxygen through the HF. The concentration of HF can vary from full strength (49 wt %) all the way down to much lower concentrations, like 0.5 oz. of 49% HF to 5 oz. of DI water. $O_2$ gas is flowed into the bath to create a vigorous bubbling for a period of 5 minutes. Once the bath is seasoned, the samples are submerged. One particular sample was submerged for 15 min. At the completion of the etch, the samples are removed and rinsed in a DI water bath three times and blown dry with $N_2$. As in the preclean, a solvent clean of acetone, IPA, and methanol is used, this time to strip off the photo resist. At this point the remaining Ag on the surface can be removed with a Piranha etch (same as above), followed by three dunks into DI water.

Figure 5:
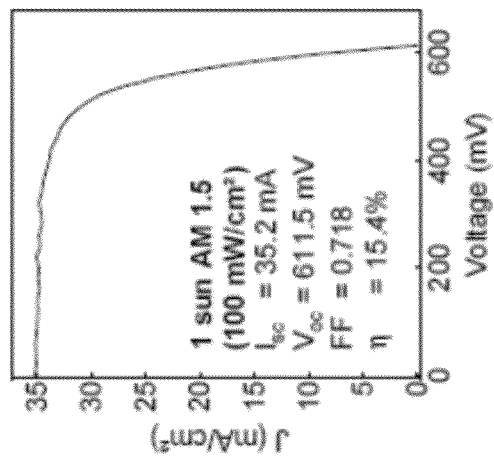
FIG. 5 is an I-V chart from a device obtained by the process described in the first exemplary process.

Next, residual thin metal from nanowire etch process is removed to provide a metal contact for electrical contact in step 450. Using processes described herein, contact resistances below about 0.0014 ohm/cm$^2$, about 0.0001 ohm/cm$^2$, and about 0.00086 ohm/cm$^2$ and efficiencies of nanowire solar cells above about 10%, about 13%, and about 15% may be achieved. FIG. 5 is an I-V chart from a device obtained by the process described in the first exemplary process. The x-axis is voltage in mV. The y-axis is energy in J(mA/cm$^2$). The current-voltage curve and efficiency of an example cell are shown in FIG. 5.

The next step is an atomic layer deposition (ALD) of alumina, which provides electrical passivation on the nanowire arrays as shown in process step 460. The preclean for the ALD is an HF dip (1 oz 49% to 4 oz. water for 30 seconds at RT) and three rinses in DI wafer.

Within 10 minutes the samples are placed inside the ALD chamber, for example a Cambridge Nanotech Savannah S200. The ALD chamber is preheated to 250° C. prior to loading our samples. After the samples are loaded, the chamber is pumped with a rough pump while a constant flow of $N_2$ at 20 SCCMs is introduced into the chamber. The pressure is around 600 mTorr with this process. The program is set to make the process wait until the heaters are at 250° C. Once the temperature is at 250° C., the program waits another 60 seconds and pulses three times with water, and three times with Trimethylaluminum (TMA). The program is then set to switch between pulsing once with water and then once with TMA 272 times. Each pulse is 15 ms, with a wait of 5 s between pulses. The cells are then removed and activated at 460° C. in forming gas for 1 hour. Before electrical measurements are performed, the alumina sometimes needs to be scratched to contact the metal beneath the alumina film.

For metal enhanced etching one can use HF and a liquid oxidizer, such as $H_2O_2$, or use a gas oxidizer such as oxygen gas. For example, one method can use oxygen gas bubbled through a dilute HF solution to preform the metal enhanced etching of silicon to form nanostructures. Such a system is disclosed in PCT publication No. 2010/042209 "Process for Structuring Silicon", the entire contents of which are incorporated by reference.

Wires made from certain processes of the invention have a minimal taper that results in the wire diameter increasing slightly as the etch progresses. For some applications, the HF concentration should be low to minimize the taper, but for photovoltaic applications, a taper might actually be beneficial. For example, with a slight taper, free carriers in the nanowire would be expected to bounce off the edges of the wire and propagate downward to the bulk substrate. If the junction is in the bulk, this increased diffusion towards the bulk will increase the cell efficiency.

B. First Alternative

After following the process referenced above (without alumina passivation), the metal finger can be removed after the nanowire etch leaving a raised non-nanostructured (bulk) silicon region adjacent to a nanowire array. The sample can then be doped with a conventional process such as ion implantation, solid source diffusion, or gas phase diffusion. An example of this process flow is shown in FIGS. 6A-F. In FIG. 6A, the material to block the nanowire etch 601 is deposited on top of the silicon substrate 602. Instead of a metal to block the nanowire etch, other materials that are resilient to the nanowire etch can alternatively be used. Some examples of materials that could block the nanowire etch include polystyrene, wax, thick metal including silver, tungsten, and photo resist. In FIG. 6B, a thin metal is uniformly deposited which then facilitates the nanowire etch shown in FIG. 6C, where nanowires are formed 604 and a layer of the thin metal 603 remains. Thin metals can be silver, gold, or any metal that enhances the etching of silicon in the presence of an oxidizer and HF. The step shown in FIG. 6D demonstrates the removal of the thin metal 603 and the step shown in FIG. 6E the removal of the material to block the nanowire etch 601. The removal of both the thin metal 603 and the thick metal 601 can be performed in the same step. Both thick and thin metal can be removed with, for example, a Piranha clean for silver. The step shown in FIG. 6F then demonstrates a doping process resulting in a doped layer in the substrate 602. The dopants used in this embodiment are similar to those discussed above, for example, arsenic, phosphorous, or boron. The samples can be doped such that the non-nanostructured silicon 608 is doped more heavily than the nanostructured silicon 607. For example, the raised structure could be doped higher than $5e18$ $cm^{-3}$, $1e19$ $cm^{-3}$, or $5e^{19}$ $cm^{-3}$ while the nanowires could be doped less than $1e17$, $1e18$, or $5e18$ $cm^{-3}$. In some embodiments, metal fingers can then be applied on top of the raised non-nanostructure to form contacts. The higher doping under the metal finger contact compared to the nanostructured region forms a selective emitter and allows for good contact resistance and good blue response (from the lower doping).

Figure 6G:
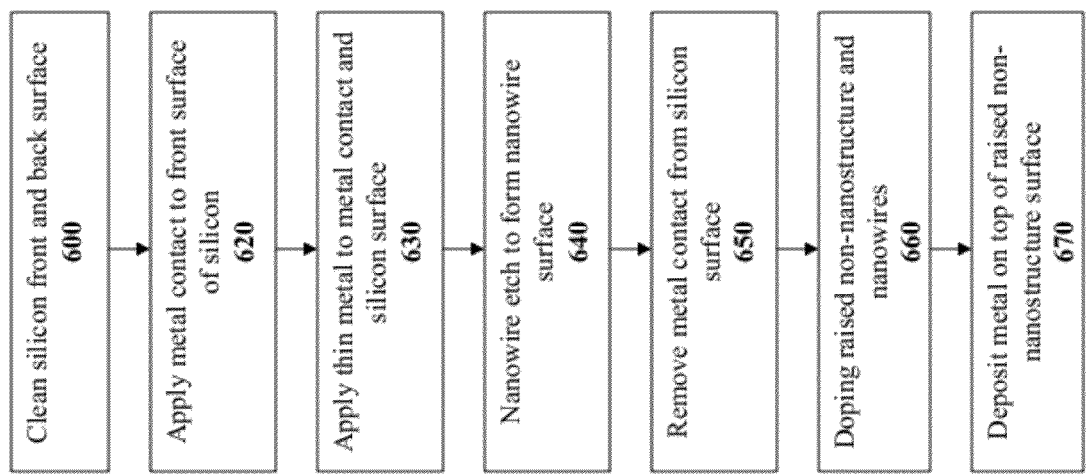
FIG. 6G is high level flow chart of the processing scheme described in FIGS. 6A-F, according to some embodiments of the present disclosure.

This process flow is shown in FIG. 6G. In the first step 600, the silicon front and back surface is cleaned. In the second step 620, the material to block the nanowire etch is applied to the front surface of the silicon. This material can be applied using a finger mask. Then a thin metal is applied over the full substrate, as shown in step 630. In the fourth step 640, a nanowire etch is performed to form a nanowire surface. In step 650, the material used to block the nanowire etch and the thin metal are removed. In step 660, the raised non-nanostructure and the nanowires are optionally doped. As discussed above, the raised non-nanostructure can be doped more heavily than the nanowires. Finally, as shown in step 670, a metal contact can be deposited on the raised contact structures using conventional processing such as evaporation, sputtering, ink jet printing, or screen printing.

C. Second Alternative

Using dopant or doped material under the metal fingers and then etching off the doping elsewhere on the sample results in a selective emitter. Possible dopants include phosphorus, arsenic, and boron. In addition, one may employ materials that dope silicon or materials containing dopants which include boric acid, phosphoric acid, aluminum, and doped silicon (including amorphous silicon).

Figure 7:
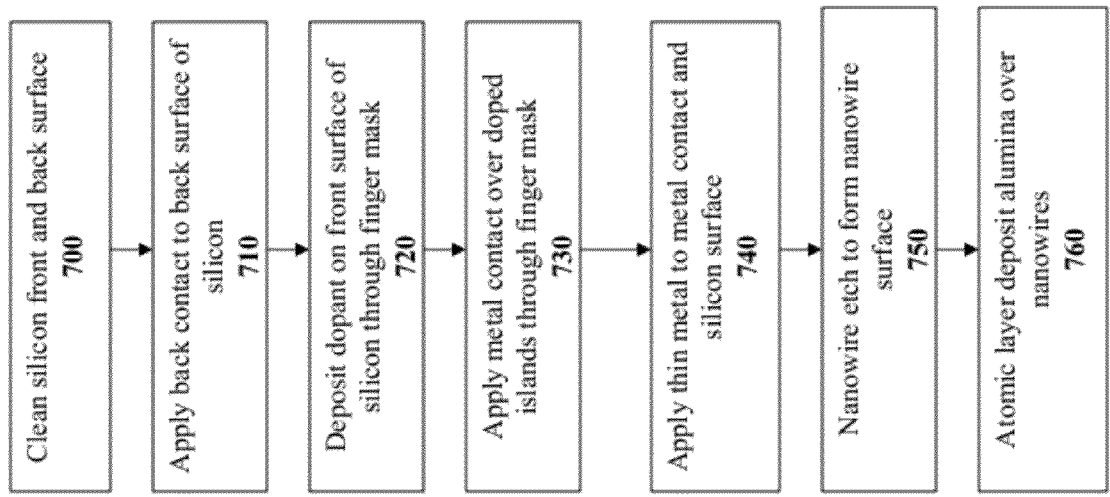
FIG. 7 is high level flow chart of a third processing scheme according to some embodiments of the present disclosure.

Alternatively, one can deposit a doped material on the substrate prior to depositing the metal finger(s), using the same finger mask, as is shown in Scheme 3, illustrated in FIG. 7. This only will deposit the doped material in the areas that will also have the metal finger(s). Process steps 700 and 710 are similar to steps 400 and 410 as previously described in Schemes 1 and 2. In process step 720, the finger mask is placed over the cleaned surface of the front surface prior to exposing the substrate to dopant. Dopant diffuses into the substrate face only in those areas exposed by the finger mask. In process step 730, metal is deposited through the finger mask to provide metal finger contacts as in a manner described previously in step 420 of Scheme 1 and step 425 of Scheme 2. In process step 740, a layer of thin metal is applied to metal contact and silicon surface, as in step 430 of Schemes 1 and 2. In process step 750, the nanowire is etched as in a manner described previously in step 440 of Scheme 1 Scheme 2. In process step 760, alumina is deposited via atomic layer deposition over the nanowires, as in step 460 of Schemes 1 and 2.

D. Third Alternative

Instead of using the tungsten silver stack for the raised contact, thick silver can be used instead. For example, fingers may be made by sputtering 2000 Å of silver through a mask on the front of the wafers. A thin 65 Å of silver without a mask is deposited on top of this thicker metal. The nanowire-forming etch is performed as described above. When the thin metal is etched with Piranha, the thicker finger metal may also be removed, leaving a non-nanowire contacting structure. After an HF dip to remove the oxide deposited by the Piranha etch, the fingers can be reapplied to the areas that were blocked by the thick silver (i.e., to the contacting structure). Using this method Al (or another metal) fingers may be deposited on the front of the wafer on top of a raised (non-etched) silicon area. Al may then be deposited on the back side of the wafer without a mask.

E. Fourth Alternative

Some designs might require that the silver at the base of the wires (useful for submerged contacts) remain intact. In this case, a thick silver film is used to block the nanowire etch on the fingers. In addition, the Piranha clean is skipped. The thick silver film remains in electrical contact with the submerged contact, making a convenient way to electrically access the submerged contact.

F. Oxidizing Agents

As noted above, the nanowire-forming etch preferably employs an oxidizing agent. An oxidizing agent (also called an oxidant or oxidizer) is a substance that readily transfers oxygen atoms or tends to gain electrons in a redox chemical reaction. One such oxidizer is pure oxygen, which may be introduced by bubbling oxygen through the HF. Other oxidizers include: ozone, chlorine, iodine, ammonium perchlorate, ammonium permanganate, barium peroxide, bromine, calcium chlorate, calcium hypochlorite, chlorine trifluoride, chromic acid, chromium trioxide (chromic anhydride), peroxides such as hydrogen peroxide, magnesium peroxide, dibenzoyl peroxide and sodium peroxide, dinitrogen trioxide, fluorine, perchloric acid, potassium bromate, potassium chlorate, potassium peroxide, propyl nitrate, sodium chlorate, sodium chlorite, and sodium perchlorate.

G. Applications

While the discussion above has been in terms of solar cells, the processes and device designs of the invention may be applied to silicon nanowire arrays for optoelectronic devices (see reference (b)). They may be employed in devices that utilize the photoelectric or photovoltaic effect, not only solar cells (see, e.g., references (c) and (d)) but also for example photodetectors, photodiodes (see reference (a)), phototransistors, photomultipliers and integrated optical circuits.

While the discussion above has been in terms of silicon nanowires, the processes and device designs of the present disclosure may be applied to black silicon as well as nanowires. Black silicon can include nanowires, porous silicon, any type of silicon having a needle-shaped surface structure, and any type of silicon having a graded index of refraction. Accordingly, devices can be manufactured according to the methods and designs described above from black silicon.

Processes and designs of the invention may be employed to produce devices made out of or comprised of polycrystalline silicon. The invention encompasses processes and designs, which can be used with any crystalline orientation of silicon, including polysilicon. Polysilicon is a cheaper material than crystalline silicon, but it is typically more difficult to texture and structure than single crystal silicon due to the random orientation of the grains. The processes and designs of the invention can likewise be used to form nanowires in amorphous silicon.

Processes and designs of the invention may be used to contact nanostructures which make silicon into an intermediate band photovoltaic material (IBPV). (See reference (f)). Silicon has an excellent band structure for IBPV, provided that the strength of particular electronic transitions can be enhanced. One way to do this is to form a dense array of silicon nanowires with specific control over the wire diameter, doping, and crystallographic orientation, as described in reference (b). Processes and designs of the invention may be used for contacting such nanowire arrays.

References: (a) K. Peng, Z. Huang, and J. Zhu, *Adv. Mater.* 16 (1) (2004) 73-76; (b) U.S. Patent Application Publication No. 2007/0278476, filed Feb. 27, 2007; (c) L. Tsakalakos, J. Balch, J. Fronheiser et al., *App. Phys. Lett.* 91 (23) (2007) 233117; (d) M. D. Kelzenberg, D. B. Turner-Evans, B. M. Kayes et al., *Nano Lett.* 8 (2) (2008) 710-714; (e) C. K. Chan, H. Peng, G. Liu, K. McIlwrath, X. F. Zhang, R. A. Huggins, and Y. Cui, *Nature Nanotech.* 3 (2008) 31-35; (f) A. Luque, A. Martí, *Phys. Rev. Lett.* 78 (26) (1997) 5014-5017; (g) Hui Fang, Xudong Li, Shuang Song, Ying Xu, and Jing Zhu, *Nanotechology* 19 (2008) 255703; (h) R. J. Martin-Palma, L. Vázquez, J. M. Martínez-Duart, M. Schnell, and S. Schaefer, *Semicond Sci. Technol.* 16 (2001) 657-661; (i) D. H. Neuhaus, A. Münzer, Advances in OptoElectronics (2007) 24521.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

What is claimed is:

1. A device comprising:
    (a) a substrate, having a top surface, a bottom surface and a first impurity type;
    (b) an array of silicon nanowires having a second impurity type, a base and a top surface, wherein the base contacting a surface below the top surface of the substrate;
    (c) a contacting structure comprised of the same material as the substrate having a non-nanostructured surface of a dimension suitable for forming an electrical contact, located on the same side of the substrate as the array of silicon nanowires, wherein the contacting structure having the second impurity type;
    wherein the surface of the contacting structure is doped with a greater impurity concentration than the nanowire array, thereby forming a selective emitter;
    wherein the top surface of the array of nanowires is at approximately the same level as the non-nanostructured surface of the contacting structure; and
    wherein the doping of the nanowire array results in a p-n junction below the base of the nanowire array.

2. The device of claim 1, wherein the device is a photovoltaic cell.

3. The device of claim 1, further comprising: (d) a conductive layer in contact with the non-nanostructured surface of the contacting structure.

4. The device of claim 3, wherein the conductive layer comprises a metal.

5. The device of claim 1, wherein the dopant level in the contact region is greater than $1e19$ $cm^{-3}$.

6. The device of claim 1, wherein the dopant comprises boron, phosphorous, or arsenic.

7. The device of claim 1, wherein the dopant level in the nanowires is less than $5e18$ $cm^{-3}$.

8. A device comprising:
(a) a substrate, having a top surface, a bottom surface and a first impurity type;
(b) a section of black silicon having a second impurity type, a base and a top surface, wherein the base contacting a surface below the top surface of the substrate;
(c) a contacting structure comprised of the same material as the substrate having a non-nanostructured surface of a dimension suitable for forming an electrical contact, located on the same side of the substrate as the section of black silicon, wherein the contacting structure having the second impurity type;
wherein the surface of the contacting structure is doped with a greater impurity concentration than the section of black silicon, thereby forming a selective emitter;
wherein the top surface of the black silicon is at approximately the same level as the non-nanostructured surface of the contacting structure; and
wherein the doping of the nanowire array results in a p-n junction below the base of the black silicon.

9. The device of claim 8, further comprising: (d) a conductive layer in contact with the non-nanostructured surface of the contacting structure.

10. The device of claim 8, wherein the conductive layer comprises a metal.

11. The device of claim 8, wherein the dopant level in the contact region is greater than $1e19$ $cm^{-3}$.

12. The device of claim 8, wherein the dopant comprises boron, phosphorous, or arsenic.

13. The device of claim 8, wherein the dopant level in the section of black silicon is less than $5e18$ $cm^{-3}$.

14. The device of claim 8, wherein the section of black silicon comprises an array of nanowires.

15. The device of claim 8, wherein the section of black silicon comprises porous silicon.

16. The device of claim 8, wherein the section of black silicon comprises silicon having a graded index of refraction.

17. The device of claim 8, wherein the section of black silicon comprises silicon having a needle-shaped surface structure.

* * * * *